United States Patent [19]
Arai et al.

[11] 4,220,810
[45] Sep. 2, 1980

[54] PRINTED WIRING BOARD

[75] Inventors: Minoru Arai, Tokyo; Akio Baba, Fuchu, both of Japan

[73] Assignee: Tokyo Print Industry Co., Ltd., Tokyo, Japan

[21] Appl. No.: 967,499

[22] Filed: Dec. 7, 1978

[30] Foreign Application Priority Data

Jun. 1, 1978 [JP] Japan ............... 53-66202

[51] Int. Cl.³ ............................................. H05K 1/00
[52] U.S. Cl. ............................ 174/68.5; 361/402
[58] Field of Search ............. 174/68.5; 361/402, 403

[56] References Cited

U.S. PATENT DOCUMENTS

| | | | |
|---|---|---|---|
| Re. 29,784 | 9/1978 | Chadwick | 174/68.5 |
| 2,990,310 | 6/1961 | Chan | 174/68.5 |
| 3,042,591 | 7/1962 | Cado | 174/68.5 |
| 3,610,811 | 10/1971 | O'Keefe | 174/68.5 |
| 3,691,632 | 9/1972 | Smith | 174/68.5 X |
| 4,104,111 | 8/1978 | Mack | 174/68.5 X |

OTHER PUBLICATIONS

Haddad et al., Printed Circuits with Diverse Metallic Topography, IBM Tech. Dis. Bull., vol. 13, #1, Jun. 1970, pp. 124 & 125.

*Primary Examiner*—Richard R. Kucia
*Attorney, Agent, or Firm*—Cushman, Darby & Cushman

[57] ABSTRACT

A new and unique printed wiring board completely free from trouble of solder bridging that often takes place with the conventional printed wiring board. The printed wiring board of the present invention is provided with a raised portion of solder resist ink in the form of a ridge around the periphery of the land to be printed or at an area between adjacent lands to be soldered, the said raised portion being an extension of a solder resist thin layer coated on the insulator base board exclusive the said land.

8 Claims, 5 Drawing Figures

PRINTED WIRING BOARD

BACKGROUND OF THE INVENTION

The present invention relates to a printed wiring board perfectly free from any possibility of solder bridging that often takes place with the hitherto known printed wiring board.

Prior to entering description of the present invention, a typical conventional printed wiring board will be briefly described with reference to FIG. 1. As illustrated in FIG. 1, the conventional printed wiring board is provided with a solder resist thin layer 1 which is coated all over the insulator base board exclusive a land 1 of a printed circuit to be soldered, the coating being effected in the regular printed method. The said solder resist thin layer 1 has a substantially constant thickness but is thiner than the land 2, that is, of conductive foil. This causes a stepped portion 2a to appear between the upper face of the land 2 and the solder resist thin layer 1 on the side wall of the said land 2, resulting in an exposed part of conductive metallic foil. Thus, particularly in case of very crowded land area such as integrated circuit where a large number of land is arranged, solder bridging often occurs between the exposed metallic surfaces during soldering operation, resulting in wrong wiring. Moreover it is pointed out as another drawback with the conventional printed wiring board that solder is insufficiently deposited on the land, because the solder resist thin layer is flat in the vicinity of the land and situated lower than the same.

To eliminate the aforesaid drawbacks with the conventional printed wiring board, the inventors carried out extensive research and development works and found out that they could resolve the problems with them by providing a raised portions of solder resist ink around the land or at the area between the lands to be soldered.

OBJECT OF THE INVENTION

An object of the present invention is to provide a printed wiring board completely free from any danger of solder bridging during soldering operation.

Other object of the present invention is to provide a printed wiring board with a plenty of solder deposited thereon during soldering operation.

Other objects and advantageous features of the present invention will be apparent from the following description.

SUMMARY OF THE INVENTION

To accomplish the aforesaid objects, a printed wiring board of the kind that at the least the predetermined position on a conductive foil circuit placed on at the least one side surface of an insulator base board is located a land to be soldered and other area exclusive the said land is covered with solder resist thin layer is proposed in accordance with the present invention, wherein around the periphery of the said land or at the area between adjacent lands to be soldered is provided a raised portion of solder resist ink, the said raised portion being an extension of the said solder resist thin layer.

The above described printed wiring board, may be manufactured by the following steps: placing an ink-permeable mesh screen above the insulator base board with an anti-ink-permeable membrane piece closely contacted with the land to be printed, the said mesh screen being integrally provided with the said anti-ink-permeable membrane piece having the same shape and located at the same position as that of the said land, applying solder resist ink over the said mesh screen and performing printing operation with the aid of a squeezing device which serves to depress the mesh screen onto the insulator base board is also proposed in accordance with the present invention. In a preferred embodiment of the present invention protrusion of the said anti-ink-permeable membrane piece from the mesh screen, that is, the substantial thickness of the said membrane piece is specified in the range of 40 to 100 $\mu$m. Printing operation is conducted by way of one pass or a plural pass of the squeezing device for depressing the mesh screen.

BRIEF EXPLANATION OF THE ACCOMPANYING DRAWINGS

The nature and characteristic features of the present invention will be apparent from the following description with reference to the accompanying drawings which illustrates a printed wiring board in the prior art and those in accordance with the present invention, in which FIG. 1 is a vertical sectional view of a printed wiring board in the prior art.

DETAILED DESCRIPTION OF A PREFERRED EMBODIMENT OF THE INVENTION

Now the present invention will be described in detail with reference to FIGS. 2 to 5, which illustrate a preferred embodiment of the present invention.

Figure 1:
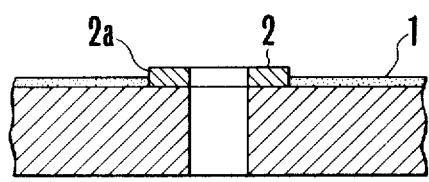
Figure 2:
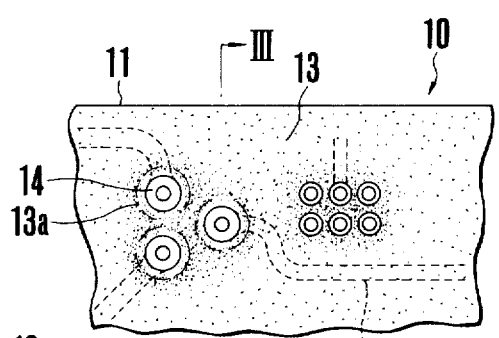
FIG. 2 is a plan view illustrating a part of a printed wiring board in accordance with the present invention.

First, referring to FIG. 2, on one side of the insulator base board 11 is provided a solder resist thin layer 13 which is coated only over the area of a printed wiring board 10 with a conductive foil circuit 12 located thereon, where no soldering is required. Further in the predetermined position on the said conductive foil circuit 12 is located a land 14 to be soldered thereon, where the side wall of the conductive foil circuit is nakedly exposed.

Figure 3:
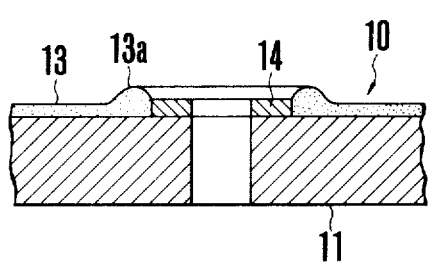
FIG. 3 is a vertical sectional view of a printed wiring board of the invention, taken in line III—III in FIG. 2.

Next, referring to FIG. 3 which is a vertical sectional view of the printed wiring board in FIG. 2, the solder resist thin layer 13 on the insulator base board 11 is provided with a raised portion 13a on the periphery of the said land 14, the said raised portion 13a being elevated above the land 14.

This raised portion 13a of the solder resist layer, which forms an essential part of the present invention, is a thicker extension from the said solder resist thin layer 13, which is produced in accordance with a specific method to be explained in detail later.

Figure 4:
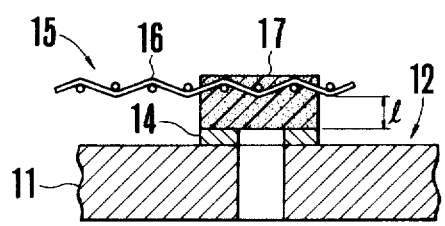
FIG. 4 is a vertical sectional view illustrating the printed wiring board with a resist printing screen placed thereabove prior to squeeze-printing.

The solder resist thin layer 13 is applied by means of the conventional printing method. To carry out printing operation for the solder resist thin layer, a resist print 15 is arranged as shown in FIG. 4. The said resist print 15 comprises an ink-permeable mesh screen 16 made of stainless wire, polyester fiber silk or other natural or synthetic fiber yarn and the said mesh screen 16 is integrally provided with an anti-ink-permeable membrane piece 17 on the predetermined position thereof, which has the same shape and is disposed at the same position as that of the said land 14.

It is arranged in accordance with the present invention that the thickness of the said anti-ink-permeable membrane piece 17, that is, the amount of protrusion of the same from the said mesh screen 16 toward the printed wiring board 10 is substantially increased in comparison with that of the prior art. Hitherto the length l of the anti-ink-permeable membrane piece 17 usually is specified to the order of 7 to 14 μm, while that for the printed wiring board of the present invention is specified wider in the range of 40 to 100 μm. This means that the anti-ink-permeable membrane use to produce the wiring board of the present invention is 2.5 to 7 times as thick as the conventional one.

In printing with resist ink, first the mesh screen 16 is located above the conductive foil circuit 12 of the printed wiring board 10 to be resist-printed. It is to be noted that at this moment the printing screen 16 is situated as if floated above the insulator base board 11 at a distance corresponding to the thickness l of the anti-ink-permeable membrane piece 17 plus the thickness of the conductive foil circuit 12, while the bottom face of the anti-ink-permeable membrane piece 17 gets contacted with the conductive foil circuit 12 of the printed wiring board 10 (see FIG. 4).

Figure 5:
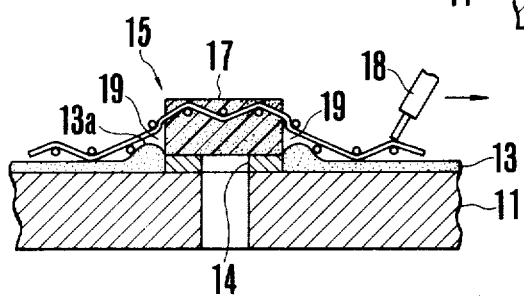
FIG. 5 is a vertical sectional view of the printed wiring board now on printing operation with the solder resist printing screen depressed thereto by means of a squeezing device.

Next the mesh screen 16 located in the aforesaid state is applied with resist ink and then depressed with the aid of a squeezing device 18 which is schematically shown in FIG. 5. Due to the depression by the squeezing device 18 the mesh screen 16 is deflected toward to insulator base board 11 during printing operation. Apparent from FIG. 5, the deflection of the mesh screen 16 becomes gradually large at the increased distance from the anti-ink-permeable membrane piece 17. But there is generated a hollow room 19 around the anti-ink-permeable membrane piece 17 between the permeable portion of the mesh screen 16 and the insulator base board 11, because no depression force is actively applied around the side face of the anti-ink-permeable membrane piece 17 by means of the squeezing device 18. Thus by depressing the said squeezing device 18 less resist ink permeates through the mesh screen 16 at the area where the same comes in contact with the insulator base board 11, but at the said hollow room 19 in which no contact is existent therebetween a considerable much quantity of resist ink permeates through the mesh screen 16, till the said hollow space 19 is filled with the ink and thereby a raised portion 13a is produced. In this connection it is to be noted that the resist ink printing operation as mentioned above is preferably conducted by a single pass of the squeezing device 18. The printing operation, however, may be conducted by a plural pass of the squeezing device 18 such as two passes, three passes etc.

Thus the solder resist thin layer 13 produced on the insulator base board 11 in accordance with the manner as described above is provided with the raised portion 13a on the periphery of the land 14, whereas other area apart from the said raised portion 13a is evenly coated with resist ink at the uniform thickness in the same way as before.

The above description is intended to disclose a typical case that a raised portion 13a is formed around a single land 14. It should be of cource understood that raised portions of solder resist ink may be formed at any densely crowded land area such as integrated circuit or the like in the same manner as mentioned above. And it is possible to make up by the said single squeezing.

The above description and accompanying drawings are merely for illustration of the present invention and the invention may be modified or changed without any departure from the spirit and scope of the invention. For instance, the said raised portion 13a of solder resist ink may be overhang along the peripheral edge of the land 14 within a limited extent. Further a printed wiring board to which the present invention is to be applied may be of other type such as through-hole board with printed wirings on the both side surfaces of an insulator base board or multi layer printed wiring board.

What is claimed is:

1. In a printed wiring board of the kind having an insulated baseboard, a conductive foil circuit disposed on at least one side surface of the baseboard, and a land to be soldered having a closed peripheral edge disposed at a predetermined position on said circuit, the improvement comprising a narrow non-planar raised portion of solder resist ink formed on said baseboard, said raised portion defining a ridge surrounding the peripheral at edge of said land, and a thin layer of solder resist ink covering said baseboard and said conductive foil circuit, exclusive of said at least one land and said ridge, said raised portion forming an extension of said thin layer and being raised above said thin layer.

2. In a printed wiring board as in claim 1 wherein the said ridge extends substantially higher than said land along the entire length of said ridge.

3. A printed wiring board as set forth in claim 2 wherein said ridge slightly overhangs the peripheral edge of said land.

4. In a printed wiring board of the kind having an insulated baseboard, a conductive foil circuit disposed on at least one side surface of said baseboard, and a plurality of lands to be soldered respectively disposed at a plurality of predetermined spaced apart positions on said circuit, the improvement comprising a ridge of solder resist ink formed on said baseboard, said ridge having a non-planar upper surface, said ridge separating one of said plurality of lands from others of said plurality lands adjacent thereto; and a thin layer of solder resist ink covering baseboard and said conductive foil circuit, exclusive of said plurality of lands and said ridge, said ridge forming an extension of said thin layer and being raised above said thin layer.

5. In a printed wiring board as in claim 4 wherein said ridge extends substantially higher than said land along the entire length of said ridge.

6. In a printed wiring board as in claim 3 or claim 2 or claim 5 wherein said ridge comprises a convex upper surface.

7. In a printed wiring board of the kind having an insulated base board having a planar upper surface, a conductive foil circuit disposed on at least said planar upper surface, and a land, having a closed peripheral edge disposed on said circuit at a predetermined location, said land having an upper surface disposed above said circuit, the improvement comprising:
- a narrow loop of solder resist ink having an upper surface extending above said land formed on said baseboard about said land; and
- a thin layer of solder resist ink covering said conductive foil circuit and said baseboard, exclusive of said land and said loop, said thin layer having an upper surface disposed entirely below the upper surface of said land, said loop forming an extension of said thin layer and extending above said layer.

8. In a printed wiring board as in claim 7 wherein said loop comprises a narrow non-planar ridge of solder resist ink having a convex closed upper surface encircling said land, said loop surface being entirely disposed substantially above said land upper surface, said ridge having an inner surface in contact with said peripheral edge along its entire length.

* * * * *